United States Patent [19]
Roesner et al.

[11] Patent Number: 5,612,233
[45] Date of Patent: Mar. 18, 1997

[54] METHOD FOR MANUFACTURING A SINGLE ELECTRON COMPONENT

[75] Inventors: Wolfgang Roesner, Munich, Germany; Thomas Vogelsang, Essex Junction, Vt.

[73] Assignee: Siemens Aktiengesellschaft, Munich, Germany

[21] Appl. No.: 403,194

[22] Filed: Mar. 13, 1995

[30] Foreign Application Priority Data

Mar. 22, 1994 [DE] Germany .......................... 44 09 863.4

[51] Int. Cl.⁶ .............................................. H01L 21/335
[52] U.S. Cl. .............................. 437/40; 437/110; 437/41; 257/28
[58] Field of Search .................................... 257/9, 28, 30, 257/39; 437/40 GS, 41 GS, 61, 110, 126

[56] References Cited

U.S. PATENT DOCUMENTS

| | | |
|---|---|---|
| 4,729,006 | 3/1988 | Dally et al. . |
| 4,769,683 | 9/1988 | Goronkin et al. .......................... 257/28 |
| 5,316,965 | 5/1994 | Philipossian et al. ...................... 437/61 |

FOREIGN PATENT DOCUMENTS

| | | |
|---|---|---|
| 544408A | 6/1993 | European Pat. Off. . |
| 63-124467 | 5/1988 | Japan ....................................... 257/28 |
| 1-13769 | 1/1989 | Japan ....................................... 257/28 |
| 4-334060 | 11/1992 | Japan . |
| 5-102469 | 4/1993 | Japan . |
| 5-145062 | 6/1993 | Japan . |
| 6-5851 | 1/1994 | Japan . |
| 6-196720 | 6/1994 | Japan . |
| 6-252417 | 9/1994 | Japan . |

OTHER PUBLICATIONS

H. I. Liu, et al., J. Vac. Sci. Technol., B10 (6) (1992) 2846 "Oxidation of Sub–50nm Si Columns for Light . . . ".
S. Wolf & R. N. Tauber, "Silicon Processing for the VLSI Era" vol. I, 1986, p. 493.
S. Wolf, "Silicon Processing for the VLSI Era" vol. II, 1990, pp. 18–19, 58–60, 194, 211.
H. Matsuoka, et al., IEEE Electron Dev. Lett., 13(1) (1992) 20 ". . . Quasi–One–Dimensional Si–MOSFET with a Dual Gate . . . ".
H. Matsuoka, et al., Appl. Phys. Lett., 64(5) (1994) 586 "Coulomb Blockade . . . Si–MOSFET with a Dual Gate . . . ".
Y. Wang, et al., J. Vac. Sci. Technol., B(10)(6) (1992) 2962 ". . . Single–electron transistors using e–Beam lithography".
M. I. Lutwyche et al., J. Appl. Phys., 75(7) (1994) 3654 "Estimate . . . of the Single–electron Transistor".
Translation of JP 6–5851 Jan. 1994.
Translation of JP 64–13769 Jan. 1989.
Lafarge et al, Z. Phys. B85 (1991) p. 327—Direct Observation of macroscopic charge quantization.
H. Matsuoka et al, IEDM 92, p. 781.
K. Nakazato et al, IEDM 92, p. 487.

*Primary Examiner*—Charles L. Bowers, Jr.
*Assistant Examiner*—Leon Radomsky
*Attorney, Agent, or Firm*—Hill, Steadman & Simpson

[57] ABSTRACT

In a method for manufacturing a single electron component in MOS technique, an active zone provided with a gate dielectric is defined in a silicon substrate. With assistance of a fine-structuring method, particularly with electron beam lithography, a first gate level is generated with fine structures <100 nm, the surface and sidewalls thereof being covered with an insulating layer. A second gate level is generated, this second gate level covering the fine structures of the first gate level at least in the region of the active zone.

11 Claims, 5 Drawing Sheets

METHOD FOR MANUFACTURING A SINGLE ELECTRON COMPONENT

BACKGROUND OF THE INVENTION

In the technology of integrated circuits, interest is directed to higher packing densities and/or faster switching speeds. In addition to a continuing development of traditional CMOS technique in this direction, other components are being increasingly proposed with which this goal can possibly be more expediently achieved. What are referred to as single electron components are thereby considered to be especially promising, these working with what is referred to as a Coulomb blockade. For example, an overview of such single electron components may be derived from the article by A. Gladun et al., Physik in Unserer Zeit 23 (1992), p. 159.

Such single electron components comprise one or more nodes that can only be charge-reversed via high-impedance potential barriers. This charge reversal can be effected by the quantum-mechanical tunnel effect or by a thermally activated transfer.

The charge reversal of a node having a total capacitance C by an elementary charge e corresponds to a charge transport of one electron over the potential barrier. In order to recharge the node by one elementary charge e, an energy expenditure on the order of magnitude of $e^2/C$ is required. When the thermal energy $k_B T$ ($k_B$ is the Boltzmann constant and T is the absolute temperature) of the system is far, far lower than this energy expenditure, i.e. $k_B T \ll e^2/C$, then this charge transfer is prohibited. A charge transfer is only possible by applying an adequately high, external voltage.

An estimate for the overall capacitance of the system derives from $k_B T \ll e^2 C$. $C \ll 4 \cdot 10^{-16}$ F=0.4 aF derives at the temperature of liquid helium, T=4.2 K. Single electron components that can be operated at room temperature must have an even lower capacitance. $C \ll 6 \cdot 10^{-18}$ F=6 aF derives for room temperature T=300° K.

Various components that utilize this effect have been proposed: a single electron transistor, a turn stile device, an electron pump, a single electron memory.

Whether or not these components can achieve significance on an industrial scale is dependent on whether the problem of manufacturing such low capacitances with suitable potential barriers can be satisfactorily solved.

It has been proposed (see, for example, P. Lafarge et al., Z. Phys. B 85 (1991) p. 327) to employ aluminum striplines having optimally small dimensions for manufacturing single electron components. They were structured with electron beam lithography. Tunnel barriers of $Al_xO_y$ are employed as potential barriers, these being arranged between two overlapping striplines. Such tunnel barriers exhibit capacitances of around $10^{-15}$ F=1 fF, so that these components must be operated at temperatures of around T=20 mK.

Another proposal is comprised in generating a 2-dimensional electron gas (2 DEG) in gallium arsenide, either by a delta doping or a heterostructure. Electron beam lithography is again utilized for lateral structuring. Capacitances of $2 \cdot 10^{17}$F ... $2 \cdot 10^{-16}$ Fl=20 ... 200 aF can be achieved in this way. It has therefore been proposed to locally deplete the 2-dimensional electron gas by employing a gate and to thus realize the potential barrier. The height of the potential barrier can thereby be set with external voltages.

H. Matsuoka et al., IEDM 92, p. 781, has disclosed a component in silicon MOS technique in which single electron effects have been observed. The component comprises a MOS transistor having a first gate electrode whose length between source and drain amounts to approximately 5 µm and whose width perpendicular thereto amounts to 0.13 µm. This MOS transistor therefore exhibits an extremely small width. A second gate electrode is arranged in a second level, this second gate electrode comprising ridges proceeding transversely over the first gate electrode that each respectively comprise a width of 0.14 µm and a mutual spacing of 0.16 µm. The transistor channel can be constricted by lateral field influence by applying a corresponding control voltage to the second gate electrode. Measured characteristics are thereby interpreted such that a series of nodes arise upon constriction that are respectively separated from one another via potential barriers and such that a Coulomb blockade occurs: The first and the second gate electrode in this arrangement are structured by electron beam lithography. An adjustment of the second electron beam lithography to the first electron beam lithography must thereby occur, this involving increased processing expense.

SUMMARY OF THE INVENTION

It is an object of the invention to specify a method for manufacturing a single electron component wherein the single electron component is manufactured in silicon MOS technique with at least two gate levels, whereby the two gate levels are manufactured self-aligned relative to one another.

According to the method for manufacturing a single electron component according to the invention, an active zone is defined in a silicon substrate. A surface of the active zone is provided with a gate dielectric. A first gate level is produced that comprises fine structures having dimensions of <100 nm in one dimension with the assistance of a fine-structuring method. A surface and side walls of the first gate level are provided with an insulating layer. A second gate level is generated that covers the fine structures of the first gate level at least in a region of the active zone.

In the inventive method, the surface of an active region in a silicon substrate is provided with a gate dielectric. A first gate level is produced thereon with the assistance of a fine-structuring method, this first gate level comprising fine structures having dimensions <100 nm in one expanse. Every method that can manufacture structures having dimensions below 100 nm is suitable as a fine-structuring method. Electron beam lithography is preferably utilized as a fine-structuring method. For achieving extremely small dimensions in the range of 10 nm, it is advantageous to generate the electron beam for the electron beam lithography with the assistance of a scanning tunnel microscope.

The first gate level is structured such that there are regions wherein the surface of the gate dielectric is uncovered.

A surface and sidewalls of the first gate level are provided with an insulating layer. Subsequently, a second gate level is generated that covers the fine structures of the first gate level at least in the area of the active region.

It lies within the scope of the invention that the fine structures of the first gate level comprise dimensions <100 nm in two expanses, i.e., the fine structures comprise surface elements having side lengths of respectively <100 nm. In this case, only one fine-structuring method, particularly electron beam lithography, is required for structuring the first gate level. The second gate level and the active region can be generated with the assistance of conventional lithography. The location and dimensions of nodes or potential barriers of the single electron component are defined by the fine structures of the first gate level.

According to a further embodiment of the invention, an insulating layer is applied onto the substrate for definition of the active region. The insulating layer is structured with the assistance of a fine-structuring method, particularly electron beam lithography, such that the surface of the silicon substrate is uncovered in the area of the active region. The active region is generated in a form such that it at least partially comprises a strip-shaped cross section. The width of the strip thereby amounts to <100 nm.

In this embodiment, the first gate level is produced such that it comprises strip-shaped structures that proceed transversely relative to the strip-shaped cross section of the active region. The strip-shaped structures also comprise a width <100 nm in one dimension.

A single electron component is manufactured in this way wherein nodes and potential barriers are defined by the intersecting points between the strip-shaped structures of the first gate level and the strip-shaped cross section of the active region. The strip-shaped structures of the first gate level are thereby realized both by elevated structures of conductive material that act as a gate electrode as well as by spacings between elevated structures.

According to a version of this embodiment, the first gate level is structured such that it comprises two gate electrodes that are electrically separated from one another. Both gate electrodes contain a strip-shaped structure proceeding transversely to the strip-shaped cross section of the active region, the width of the strip-shaped structure being <100 nm, and these strip-shaped structures being arranged essentially parallel to one another with a spacing of <100 nm. In a single electron component manufactured according to this embodiment, a voltage is applied to the second gate level such that inversion regions form outside the first gate level in the active region. Three inversion regions form, two each respectively outside the two gate electrodes of the first gate level and one between the two gate electrodes. Potential barriers between respectively neighboring inversion layers are driven via the two gate electrodes of the first gate level. Since the two gate electrodes are electrically separated, the potential barriers can be individually driven.

According to a further version of this embodiment, the first gate level is manufactured such that it comprises three gate electrodes electrically separated from one another. A middle gate electrode thereby comprises a strip-shaped structure that proceeds transversely relative to the strip-shaped cross section of the active region and whose width is <100 nm. Two lateral gate electrodes are each respectively arranged at opposite sides of the strip-shaped structure of the middle gate electrode at a spacing of <100 nm. The strip-shaped cross section of the active region extends up into the region of the lateral gate electrodes of the first gate level. In a single electron component manufactured according to this embodiment, the height of two potential barriers is permanently prescribed by a voltage applied to the second gate level. Inversion layers are established by the two lateral gate electrodes of the first gate level. A further inversion layer is set between the two potential barriers via the middle gate electrode of the first gate level. The potential path in this single electron component can be influenced by slight changes in voltage at the middle gate electrode so that a charge reversal of the node that is formed by the inversion layer arranged under the middle gate electrode occurs.

Preferably, the insulating layer that is employed for the definition of the active region is formed of $SiO_2$ by thermal decomposition of $Si(OC_2H_5)_4$ (TEOS). The first gate level is formed by deposition and structuring of a first doped silicon layer; and the second gate level is formed by deposition and structuring of a second doped silicon layer. The doped silicon layer is preferably amorphously deposited in the temperature range (555 . . . 565)° C., whereby dopant is added to the process gas. The deposition as an amorphous layer assures that narrow trenches in the respective surface are also filled. The active region is provided with two terminal regions that are arranged outside the first gate level and outside the second gate level. The terminal regions are arranged such that a current through the active region between the two terminal regions is controlled by the first gate level or second gate level. The terminal regions are preferably formed by implantation in the silicon substrate.

DESCRIPTION OF THE PREFERRED EMBODIMENTS

Figure 1:
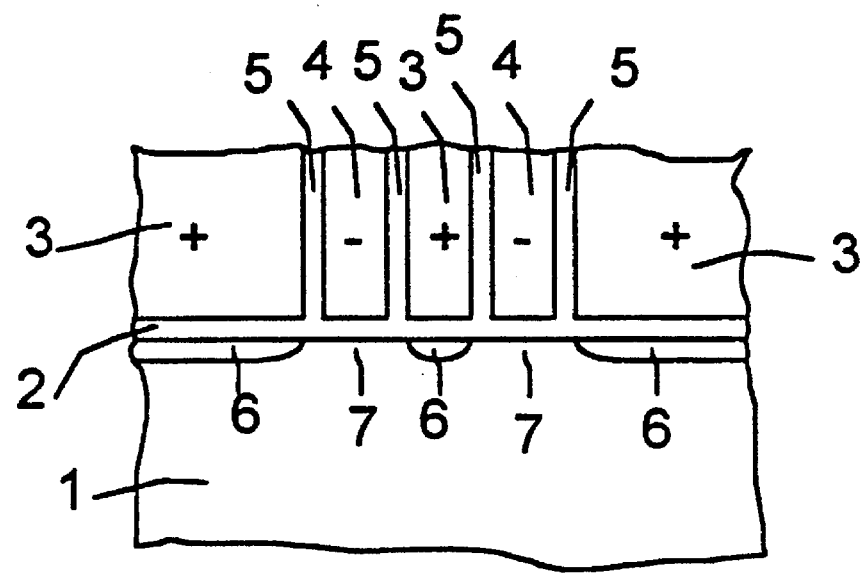
FIG. 1 shows a section through a single electron component manufactured according to the invention.

A gate oxide layer 2 (see FIG. 1) is applied onto a silicon substrate 1 that, for example, is p-doped with a dopant concentration of, for example, $10^{15}$ cm$^{-3}$. A first gate level 3 and a second gate level 4 are produced, these being each respectively composed of doped, amorphous or polycrystalline silicon. The first gate level 3 comprises three gate electrodes; the second gate level 4 comprises two gate electrodes. The individual gate electrodes are laterally insulated from one another by insulating ridges 5.

Figure 2:
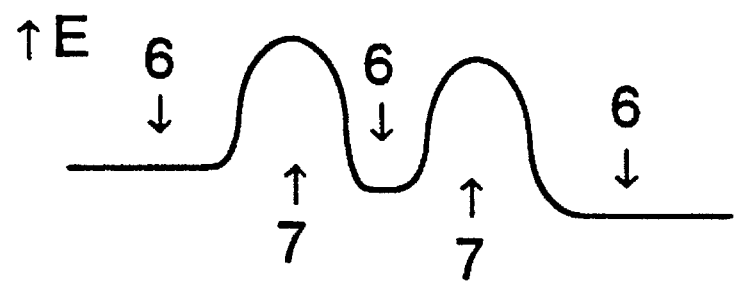
FIG. 2 shows the curve of potential in the single electron component illustrated in FIG. 1.

The functioning of a component to be manufactured according to the method of the invention shall be set forth first with reference to FIG. 1 and FIG. 2.

By applying a positive voltage to the gate electrodes of the first gate level 3, inversion layers 6 are formed at the surface of the silicon substrate 1. The lateral expanse of the inversion layers 6 is established by the geometry of the electrodes of the first gate level 3. The inversion layer 6, which is allocated to the middle gate electrode of the first gate level 3, comprises, for example, an essentially circular cross section having a diameter of 20 nm and has an overall capacitance of 10 aF. The spacing between the middle gate electrode and the lateral gate electrodes of the first gate level 3 amounts, for example, to approximately 40 nm. The gate electrodes of the second gate level 4 are respectively arranged in this region.

When a negative voltage is applied to the gate electrodes of the second gate level, then potential barriers 7 form between neighboring inversion layers 6 in the silicon substrate.

The course of potential in the component shown in FIG. 1 is outlined in FIG. 2. The potential $E=-e \cdot$ surface potential. The locations of the inversion layers 6 as well as of the potential barriers 7 are entered with arrows in the curve of the potential. The potential barriers 7 prevent a free electron flow through the single electron component. The middle inversion layer 6 represents a potential well or, pit in which one electron can be stored. By varying the height of the potential barriers 7 or the depth of the potential well of the middle inversion layer 6 as a result of drive from the outside, an electron flow through the component can occur. Such a component is referred to as a single electron transistor, SET, in the literature. This component can be operated at a temperature of 4° K.

Figure 3:
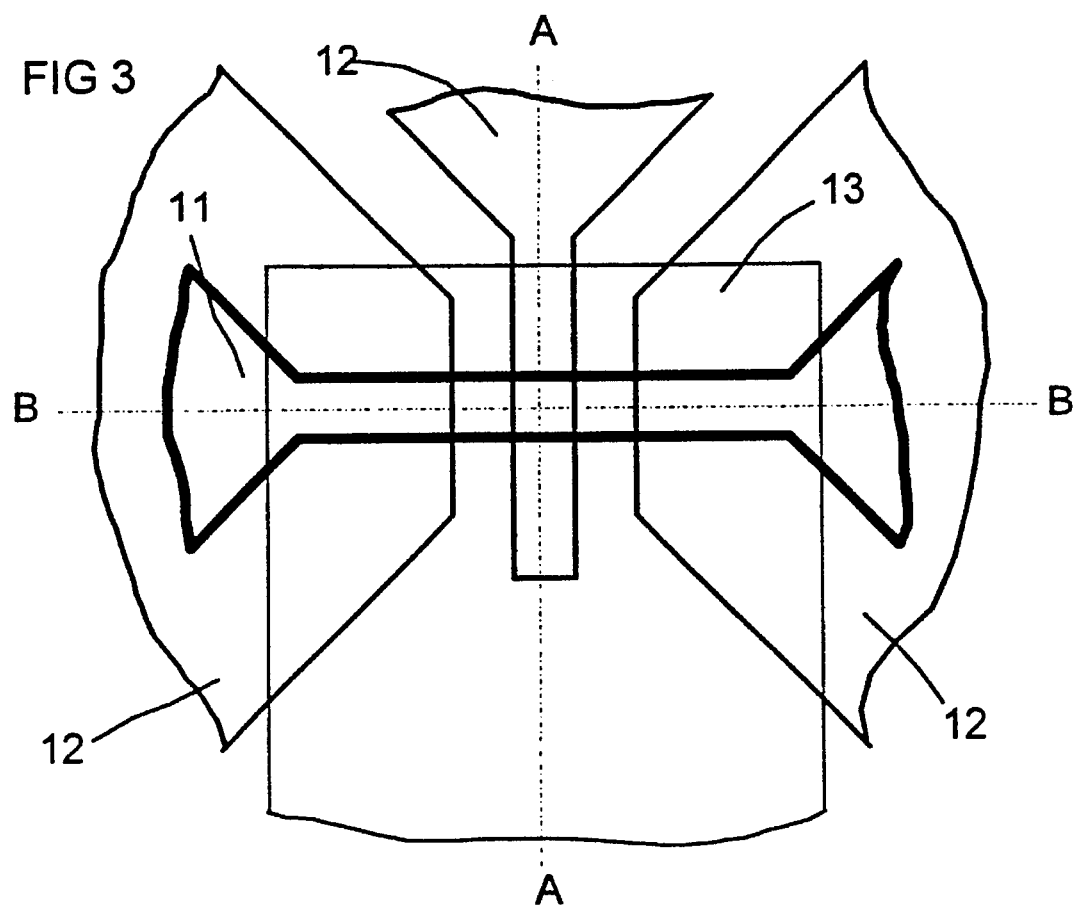
FIG. 3 shows a layout of a single electron component manufactured according to the invention.

FIG. 3 shows a layout of a single electron component manufactured according to the invention. An active zone 11 at least partially comprises a strip-shaped cross section that comprises a width <100 nm, and preferably of 30 nm, in one dimension. A first gate level 12 that comprises three gate electrodes is arranged above the active zone 11. A middle gate electrode of the first gate level 12 comprises a strip-shaped structure that crosses the strip-shaped cross section of the active zone 11. The strip-shaped structure comprises a width of <100 nm, and preferably 30 nm. Further, the first gate level 12 comprises two external gate electrodes that cross the strip-shaped cross section of the active zone with an essentially straight sidewall, and a spacing of <100 nm, and preferably 30 nm, exists between their essentially straight sidewall and the middle gate electrode.

Toward the outside, both the active zone 11 as well as the gate electrodes of the first gate level 12 broaden. The two outer gate electrodes of the first gate level 12 cover the active zone 11 at the edge of the strip-shaped cross section thereof. Outside FIG. 3, however, the active zone 11 laterally projects beyond the first gate level 12 and is provided with highly doped terminal regions at both sides. A second gate level 13 is arranged above the first gate level 12. The second gate level 13 at least covers the strip-shaped cross section of the active zone as well as the intersecting points of the fine structures of the first gate level 12 with the active zone 11.

In this single electron component, inversion regions are formed at the first gate level 12 by appropriate voltages. Potential barriers are set by appropriate voltages at the second gate level 13.

For manufacturing the single electron component set forth with reference to FIG. 3, an insulating layer 15 of $SiO_2$ is applied onto a silicon substrate 14 (see FIG. 4). The insulating layer 15 is preferably manufactured by thermal decomposition of $Si(OC_2H_5)_4$ (TEOS) in a thickness of 100 nm.

The insulating layer 15 is structured with the assistance of electron beam lithography. The surface of the silicon substrate 14 is thereby uncovered. The structured, insulating layer 15 defines the active zone 11 on the surface of the silicon substrate 14. FIG. 4 shows the section referenced A—A in FIG. 3. FIG. 5 shows the section referenced B—B in FIG. 3.

For structuring the insulating layer 15, an anisotropic etching process with, for example, $CHF_3$, $O_2$ is implemented after the electron beam lithography. Subsequently, the resist employed in the electron beam lithography is removed.

A gate oxide 16 having a thickness of, for example, 16 nm is produced on the uncovered surface of the silicon substrate 14 with a dry, thermal oxidation.

A first doped silicon layer is deposited surface-wide in a thickness of, for example, 100 nm and is n-doped by phosphorous diffusion with POCl. The doped polysilicon layer completely fills a trench in the insulating layer 15 that is caused by the strip-shaped cross section of the active zone 11.

After the removal of $SiO_2$ deposited in the phosphorus diffusion by wet-chemical etching of 100 nm $SiO_2$, a $SiO_2$ layer 17 is applied surface-wide. The $SiO_2$ layer 17 is applied, for example, by thermal composition of TEOS with a thickness of 100 nm.

The $SiO_2$ layer 17 and the doped polysilicon layer are subsequently structured with the assistance of electron beam lithography, whereby the first gate level 12 arises from the doped polysilicon layer. In the structuring of the doped polysilicon layer, the $SiO_2$ layer 17 is thinned above the active zone, as may be derived from FIG. 5. The $SiO_2$ layer 17 and the doped polysilicon layer are each respectively structured by anisotropic etching. The etching of the $SiO_2$ layer 17 occurs with $CHF_3$, $O_2$. The resist employed in the electron beam lithography is removed before the etching of the doped polysilicon layer. The structured $SiO_2$ layer 17 is employed as a mask for etching the polysilicon layer with, for example, HBr, $Cl_2$.

Figure 4:
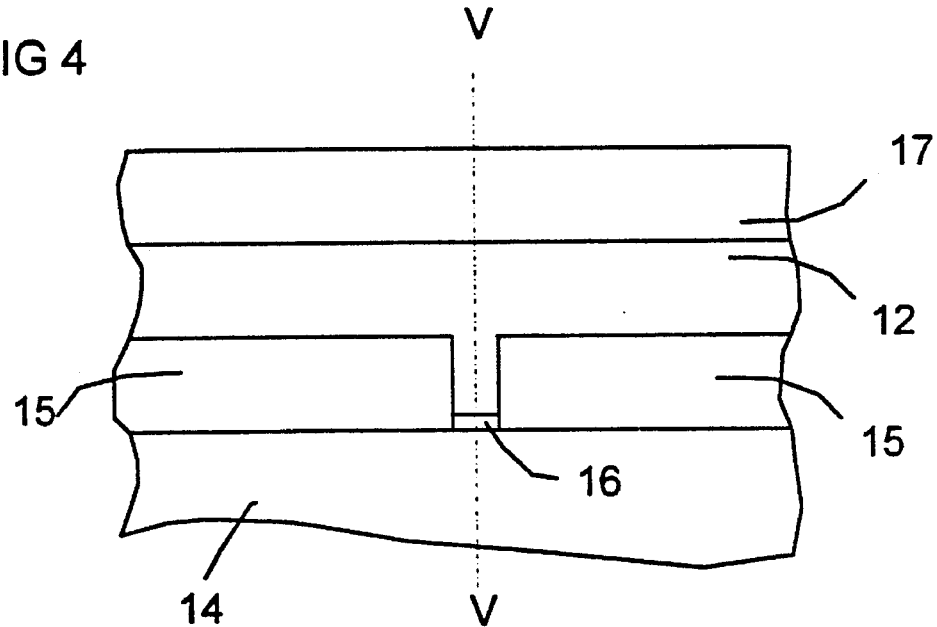
FIG. 4 shows a section through a silicon substrate having a structured, insulating layer that defines an active region, having a gate dielectric, having a first gate level and an $SiO_2$ layer.
Figure 5:
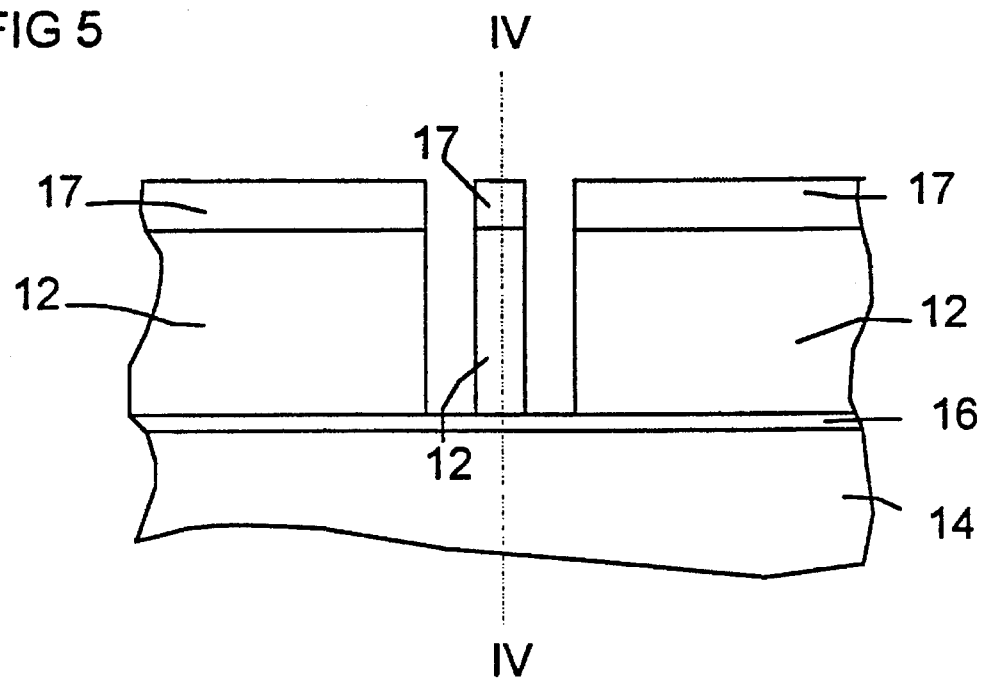
FIG. 5 shows the section referenced V—V in FIG. 4.

The section illustrated in FIG. 5 is indicated by the broken line V—V in FIG. 4. In FIG. 5, the section shown in FIG. 4 is referenced by the broken line IV—IV.

Subsequently, $SiO_2$ spacers are produced at uncovered sidewalls of the first gate level 12. This occurs, for example, with a dry, thermal oxidation in a thickness of 16 nm or by CVD deposition of a $SiO_2$ layer and, subsequently, anisotropic re-etching (see FIG. 6).

For forming the second gate level 13, a second polysilicon layer is subsequently deposited in a thickness of, for example, 100 nm. The second polysilicon layer is structured with the assistance of conventional photolithography and anisotropic etching, whereby the second gate level 13 arises. The second doped polysilicon layer must be deposited such that it completely fills the trenches that arise due to the spacings between the middle gate electrode and the outer gate electrodes of the first gate level 12 (see FIG. 3). After the removal of the photoresist that was employed in the photolithography, the second gate level 13 is n-doped by implantation of arsenic with an implantation energy of 50 keV and given a particle density of $5 \cdot 10^{-15}$ $cm^{-2}$. The dopant is activated in a tempering in inert gas at 900° C.

Figure 6:
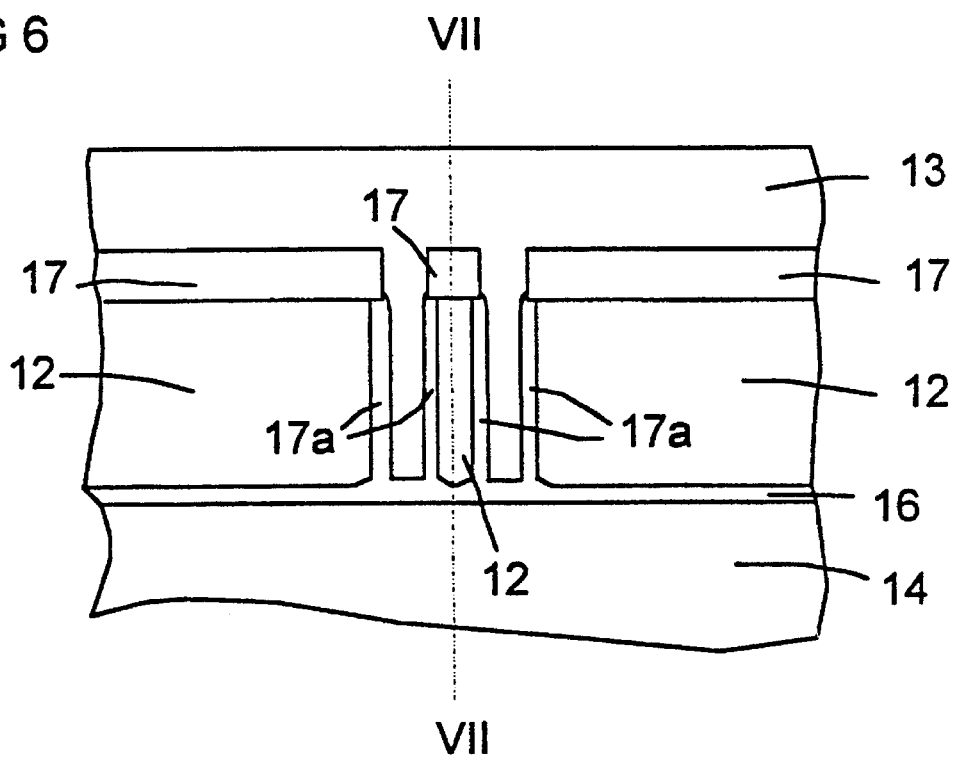
FIG. 6 shows the silicon substrate after the formation of $SiO_2$ spacers at vertical sidewalls of the first gate level and after the production of the second gate level.
Figure 7:
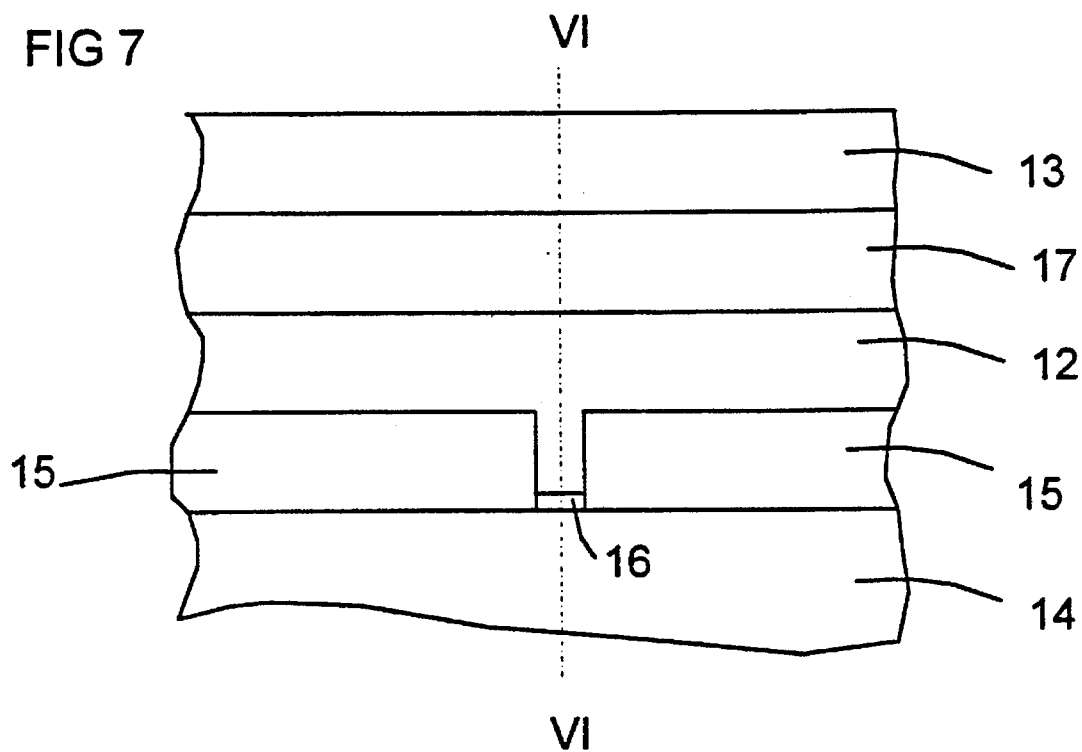
FIG. 7 shows the VII—VII section referenced in FIG. 6.

The section shown in FIG. 7, which corresponds to the section referenced A—A in FIG. 3, is entered in FIG. 6 with VII—VII. The section shown in FIG. 6, which corresponds to the section referenced B—B in FIG. 3 is entered in FIG. 7 with VI—VI. For finishing the component, an intermediate oxide is subsequently deposited via holes opened therein, and are provided with metallizations. These method steps are not shown.

Figure 8:
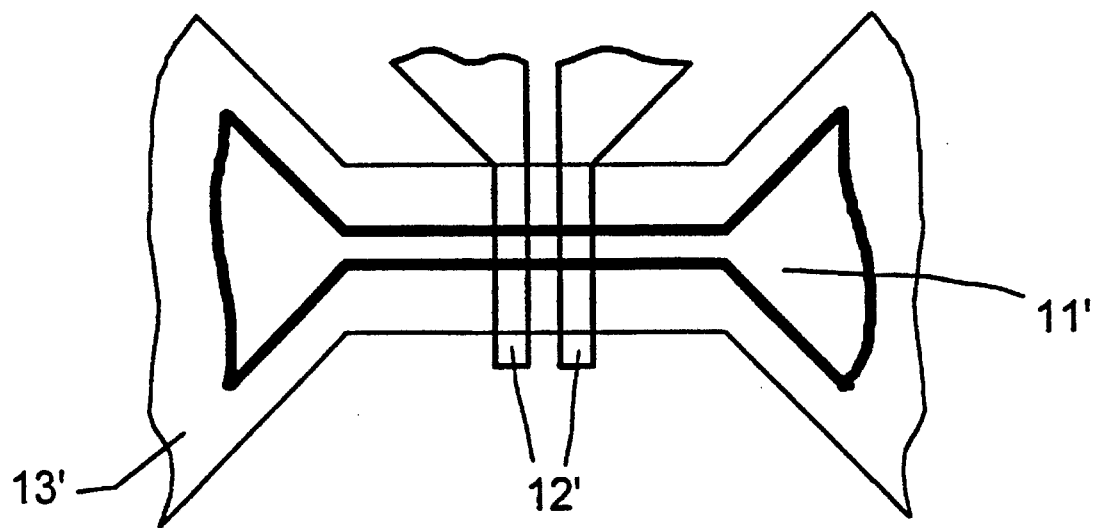
FIG. 8 shows a layout of a second embodiment of a single electron component manufactured according to the invention.

FIG. 8 shows the layout of a further component that can be manufactured in the method of the invention. An active zone 11' at least partially comprises a strip-shaped cross section that has a width <100 nm, and preferably 30 nm, in one dimension. A first gate level 12' arranged thereover comprises two gate electrodes each of which respectively contains a strip-shaped structure. The strip-shaped structures of the two gate electrodes comprise respective widths <100 nm, and preferably 30 nm, in one dimension. The gate electrodes of the first gate level 12' are arranged such that the strip-shaped structures cross the strip-shaped cross section of the active zone 11'. A second gate level 13' that at least covers the strip-shaped cross section of the active zone 11' is arranged above the first gate level 12'.

Inversion layers are produced in the active zone in this single electron component by applying a voltage to the second gate level 13'. The height of the potential barriers that are arranged under the gate electrodes of the first gate level 12' is controlled by applying voltages to the gate electrodes of the first gate level 12'.

Electron beam lithography is respectively required for manufacturing this electron beam component in the formation of the active zone 11' as well as of the first gate level 12'. The second gate level 13' is manufactured with conventional photolithography. It is produced in self-aligned fashion relative to the first gate level 12'.

Figure 9:
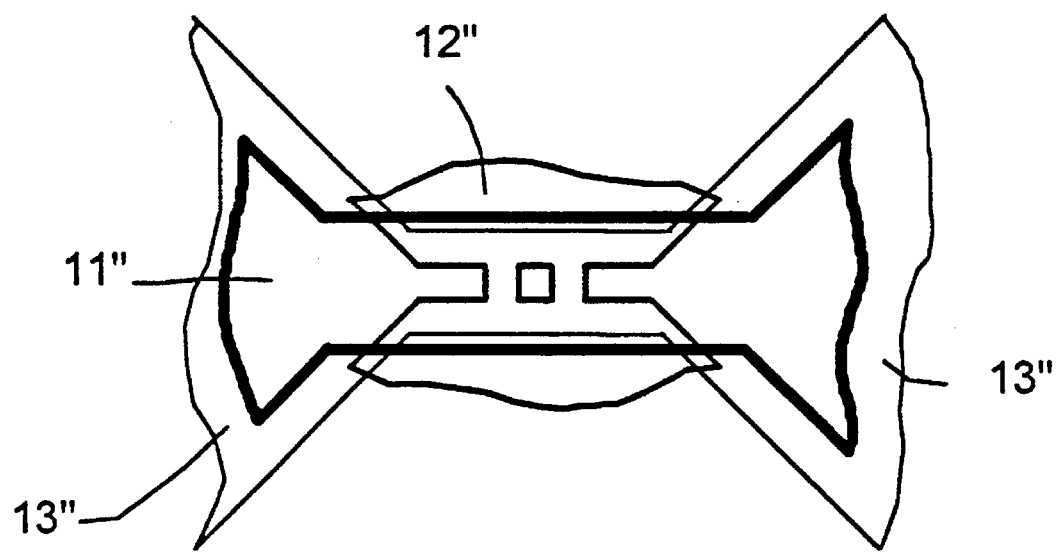
FIG. 9 shows a layout of a third embodiment of a single electron component manufactured according to the invention.

FIG. 9 shows a layout of a further single electron component that can be manufactured according to the method of the invention. For manufacturing this single electron component, a fine-structuring method, particularly electron beam lithography, is only required in the structuring of a first gate level 12''. Active zone 11'' as well as second gate level 13'' can be manufactured with dimensions that can be achieved on the basis of conventional photolithography. The first gate level 12'' comprises two main parts which, with neighboring, essentially straight sidewalls, are arranged relative to one another with a spacing of <100 nm, and preferably 30 nm. The two main parts are connected to one another via two ridges. Parallel to the essentially straight sidewalls of the two main parts, the two ridges comprise dimensions of respectively <100 nm, and preferably 30 nm. The two ridges again comprise a spacing from one another of <100 nm, and. preferably 30 nm.

The active zone 11'' and the second gate level 13'' are arranged such that they are respectively sure to cover the essentially straight sidewalls of the two main elements as well as the ridges of the first gate level 12''.

Inversion layers are generated in this single electron component by applying the voltage to the second gate level 13'' in the active zone. Potential barriers are set under the first gate level 12'' by applying an appropriate voltage. Only one electron beam lithography step is required for manufacturing this single electron component. This process simplification is acquired at the expense of the fact that the two potential barriers can only be driven in common.

Since the first gate level 12, 12' in the single electron components that were set forth with reference to FIG. 3 as well as FIG. 8 each respectively comprise electrically separated gate electrodes, the individual gate electrodes can be individually driven here. More complicated single electron components can also be constructed in this way.

Although various minor changes and modifications might be proposed by those skilled in the art, it will be understood that I wish to include within the claims of the patent warranted hereon all such changes and modifications as reasonably come within my contribution to the art.

We claim as our Invention:

1. A method for manufacturing a single electron component, comprising the steps of:
   providing a silicon substrate;
   defining an active zone in said silicon substrate by applying an insulating layer onto the substrate and structuring the insulating layer with assistance of a fine-structuring method such that a surface of the silicon substrate is uncovered in a region of the active zone, and the active zone is defined such that it at least partially comprises a strip-shaped cross-section having a width of <100 nm in one dimension;
   providing a surface of the active zone with a gate dielectric;
   producing a first gate level such that it comprises strip-shaped structures that proceed transversely relative to the strip-shaped cross-section of the active zone and wherein at least one of the strip-shaped structures of the first gate level has a width of <100 nm;
   providing an insulating layer on a surface and side walls of the first gate level;
   generating a second gate level on said insulating layer and over said surface and said side walls of the first gate level at least in a region of said active zone; and
   the first gate level providing a center gate electrode and outer gate electrodes, the second gate level providing respective gate electrodes between the central and outer gate electrodes of the first gate level, applying a positive voltage to the first gate level and applying a negative voltage to the second gate level so that inversion layers are created only under the gate electrodes of the first gate level.

2. A method according to claim 1 wherein the first gate level is produced by surface-wide deposition of a conductive layer and by subsequent electron beam lithography and anisotropic etching.

3. A method according to claim 1 when the insulating layer is structured by electron beam lithography and an anisotropic etching.

4. A method according to claim 1 wherein the first gate level comprises two gate electrodes electrically separated from one another, each of which respectively comprises a strip-shaped structure proceeding transversely relative to the strip-shaped cross-section of the active zone having a width of <100 nm, and the two electrodes being arranged substantially parallel to one another with a spacing of <100 nm.

5. A method according to claim 1 wherein the first gate level comprises three gate electrodes electrically separated from one another, a middle gate electrode thereof comprising a strip-shaped structure having a width of <100 nm that proceeds transversely relative to the strip-shaped cross-section of the active zone, and wherein two lateral gate electrodes are arranged at opposite sides of the strip-shaped structure at a respective spacing of <100 nm.

6. A method according to claim 1 including the further steps of:
   providing the active zone with terminal regions that are arranged outside the first gate level and the second gate level; and
   forming the terminal regions by ion implantation in the silicon substrate.

7. A method for manufacturing a single electron component, comprising the steps of:
   providing a silicon substrate;
   applying an $SiO_2$ layer by thermal decomposition of $Si_4(OC_2H_5)_4$ TEOS for definition of an active zone, structuring the $SiO_2$ layer, and then defining the active zone in the silicon substrate with the structured $SiO_2$ layer;
   producing a gate dielectric at a surface of the active zone by thermal oxidation;
   producing a first gate level that comprises fine structures having dimensions of <100 nm in two dimensions parallel to a surface of the active zone by deposition and structuring of a first silicon layer;
   applying an $SiO_2$ layer onto a surface and substantially vertical side walls of the first gate level, the insulating layer on the vertical side walls comprising spacers;

generating a second gate level that covers the fine structures of the first gate level at least in the region of the active zone by deposition and structuring of the second doped silicon layer; and the first gate level providing a central gate electrode and outer gate electrodes, the second gate level providing respective gate electrodes between the central and outer gate electrodes of the first gate level, applying a positive voltage to the first gate level and applying a negative voltage to the second gate level so that inversion layers are created only under the gate electrodes of the first gate level.

8. A method according to claim 7 wherein the $SiO_2$ layer is deposited in a thickness between 20 nm and 200 nm, the gate dielectric being deposited in a thickness between 5 nm and 40 nm, the first doped silicon layer being deposited in a thickness between 20 nm and 200 nm, the $SiO_2$ layer being deposited in a thickness between 20 nm and 200 nm, and the second doped polysilicon layer being deposited in a thickness between 20 nm and 500 nm.

9. A method according to claim 7 including the further steps of:

providing the active zone with terminal regions that are arranged outside the first gate level and the second gate level; and forming the terminal regions by ion implantation in the silicon substrate.

10. A method for manufacturing a single electron component, comprising the steps of:

providing a silicon substrate;

applying an insulating layer by thermal decomposition onto said silicon substrate and structuring the insulating layer to define a strip-shaped active zone having a width of <100 nm, and then providing the active zone in the silicon substrate by use of the structured insulating layer;

providing a surface of the substrate at the active zone with a gate dielectric;

producing a first gate level having fine structures comprising gate electrodes and wherein one of those fine structures has dimensions of <100 nm in two dimensions parallel to a surface of the active zone and which is produced with assistance of a fine-structuring method;

providing a surface and sidewalls of the first gate level with an insulating layer; and generating a second gate level that covers said fine structures of the first gate level at least in a region of the active zone.

11. A method for manufacturing a single electron component, comprising the steps of:

providing a silicon substrate;

providing an insulating layer on a silicon substrate and structuring the insulating layer so as to define a strip-shaped active zone having a width of <100 nm, and then providing said active zone in said silicon substrate by use of said structured insulating layer;

providing a surface of the substrate at the active zone with a gate dielectric;

producing a first gate level having fine structures comprising gate electrodes and wherein one of those fine structures has dimensions of <100 nm in two dimensions parallel to a surface of the active zone and which is produced with assistance of a fine-structuring method;

providing a surface and sidewalls of the first gate level with an insulating layer;

generating a second gate level that covers said fine structures of the first gate level at least in a region of the active zone; and providing said fine structuring only by electron beam lithography only in structuring the first gate level.

* * * * *